(12) United States Patent  
Vashchenko et al.

(10) Patent No.: US 8,497,526 B2
(45) Date of Patent: Jul. 30, 2013

(54) LOW TRIGGERING VOLTAGE DIAC STRUCTURE

(75) Inventors: Vladislav Vashchenko, Palo Alto, CA (US); Antonio Gallerano, San Jose, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 478 days.

(21) Appl. No.: 12/925,277

(22) Filed: Oct. 18, 2010

(65) Prior Publication Data

US 2012/0091501 A1 Apr. 19, 2012

(51) Int. Cl.
*H01L 29/66* (2006.01)

(52) U.S. Cl.
USPC ........... 257/133; 257/119; 257/122; 257/360; 257/E29.221; 257/E29.215

(58) Field of Classification Search
USPC .................. 257/133, 360, 119, 122, E29.221, 257/E29.215
See application file for complete search history.

(56) References Cited

U.S. PATENT DOCUMENTS

2007/0045656 A1* 3/2007 Chen .............................. 257/107
2009/0032838 A1* 2/2009 Tseng et al. ................... 257/133

\* cited by examiner

*Primary Examiner* — Michael Lebentritt
*Assistant Examiner* — Aaron Dehne
(74) *Attorney, Agent, or Firm* — Eugene C. Conser; Wade J. Brady, III; Frederick J. Telecky, Jr.

(57) ABSTRACT

In a DIAC-like device that includes an n+ and a p+ region connected to the high voltage node, and an n+ and a p+ region connected to the low voltage node, at least two MOS devices are formed between the n+ and p+ region connected to the high voltage node, and the n+ and p+ region connected to the low voltage node.

4 Claims, 2 Drawing Sheets

US 8,497,526 B2

LOW TRIGGERING VOLTAGE DIAC STRUCTURE

FIELD OF THE INVENTION

The invention relates to Electrostatic Discharge (ESD) protection devices making use of SCR-type conductivity modulation. In particular it relates to DIAC-like structures.

BACKGROUND OF THE INVENTION

Dual direction ESD protection capability is important in many applications, for example, in the case of interfaces and level shifters. A common device that meets this requirement is the DIACs, which is commonly implemented in a CMOS process with deep n-well or in the case of high voltage processes, is implemented with n-epitaxial or NISO isolation.

Two such prior art DIACs are shown in FIGS. 1 and 2. FIG. 1 shows a symmetrical CMOS DIAC that comprises a first p-well (RW) 100 and a second p-well (RW) 102 isolated from each other by an n-well (NW) 106 and a deep n-well (DNW) 110. N-wells 104, 108 extend on the outer sides of the RW 100 and the RW 102. An n+ region 120 and a p+ region 122 are formed in the RW 102. Similarly, an n+ region 124 and a p+ region 126 are formed in the RW 100. Thus the contact regions, which take the form of shorted n+ and p+ regions 120, 122 and 124, 126 are isolated by a dual blocking junction. The n-wells 104, 106, 108 are formed in a p-substrate 140, and as shown in FIG. 1, a p-well 130 is formed in the p-substrate 140. The p-well 130 is contacted through p+ region 128, which is connected to the n+ region 124 and p+ region 126. A floating n+ region 132 is formed between the RW's 100, 102.

FIG. 2 shows an asymmetrical DIAC as known in the art, which includes a single p-well (RW) 200 with an n-well on either side (NW 202 and NW 204), which extend downward to an isolating deep n-well (DNW) 210. The NWs 202, 204 and DNW 210 are formed in a p-substrate 240, as is a p-well 230. An n+ region 220 and p+ region 222 are formed in the RW 200 and are connected to each other. A p+ region 228 and an n+ region 224 are in turn formed in the PW 230, and are also connected to each other. Thus the contact regions defined by the shorted n+ 220 and p+ 222 are again isolated from the shorted n+ region 224 and p+ region 228. A floating n+ region 250 is formed between the RW 200 and the PW 230.

During operation the PAD can be above or below ground and it is important to be able to protect the PAD during both positive and negative voltage swings. However, CMOS DIACs suffer from very high triggering voltages and often require second stage protection. Since the triggering voltage can be controlled by controlling the breakdown of the diffusion blocking junction, one prior art technique in reducing the breakdown and triggering voltage is to make use of a SiGe BJT. However, there is no general solution to reducing the triggering voltage below the n+ to p-well breakdown.

SUMMARY OF THE INVENTION

According to the invention there is provided a DIAC-like structure that includes a first n+ region and a first p+ region formed in an R-well to define a first contact region, a second n+ region and a second p+ region spaced laterally from the first contact region, and at least a first and a second MOS device formed between the first and second contact regions. The first MOS device may be defined by a first gate formed over a first channel region between the first n+ region and a floating n+ region, and the second MOS device may be defined by a second gate formed over a second channel region between the floating n+ region and the second n+ region. Typically the first n+ region and first p+ region are connected to a high voltage node or pad, while the second n+ region and second p+ region are connected to a low voltage node e.g., ground. The gate of the first MOS device may be biased by connecting it via a first resistor to the high voltage node. The gate of the second MOS device may be biased by connecting it via a second resistor to the low voltage node. The structure may include additional MOS devices between a first contact region as defined by the first n+ region and the first p+ region, and a second contact region as defined by the second n+ region and the second p+ region, each MOS device including a gate. The gates of the MOS devices may be individually biased. Alternate gates may be connected to the high voltage node, while the other gates may be connected to the low voltage node.

Further, according to the invention, there is provided a method of lowering the triggering voltage of a DIAC that includes a first n+ region and first p+ region defining a first contact region spaced laterally from a second n+ region and a second p+ region defining a second contact region, and including an n+ floating region in the space between the first and second contact regions, the method comprising providing at least one MOS structure between the first and second contact regions. The first n+ region and first p+ region may be formed in a first r-well or first p-well, and the second n+ region and second p+ region may be formed in a second r-well or second p-well, wherein a first and a second MOS structure is defined between the first and second contact regions. The first MOS structure may be a first NMOS structure defined by the first n+ region and the n+ floating region with a first channel region between the first n+ region and the n+ floating region defined by part of the first r-well or first p-well. The second MOS structure may be a second NMOS structure defined by the second n+ region and the n+ floating region with a second channel region between the second n+ region and the n+ floating region defined by part of the second r-well or second p-well. Typically a poly gate is formed above each of the channel regions, the method including biasing the poly gates of the MOS structures. The method may include providing more than two MOS devices between the first and second contact regions.

DETAILED DESCRIPTION OF THE INVENTION

In order to appreciate the distinction between the prior art DIAC and the DIAC-like structure of the present invention, a prior art DIAC (shown in cross section in FIG. 3) is compared below to the three embodiments of a DIAC-like structure of the invention.

Figure 2:
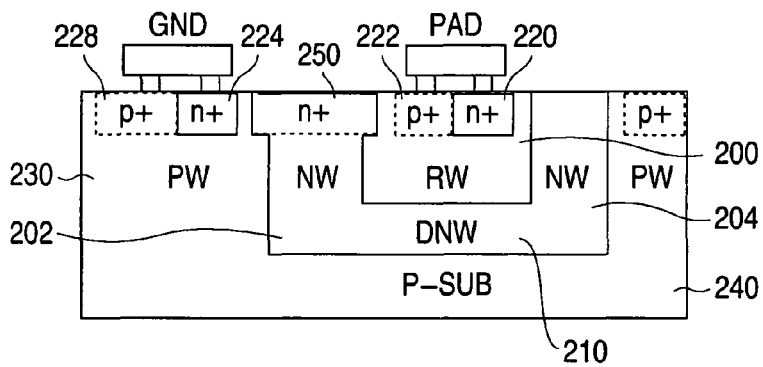
FIG. 2 is a sectional side view through an asymmetrical prior art DIAC.
Figure 3:
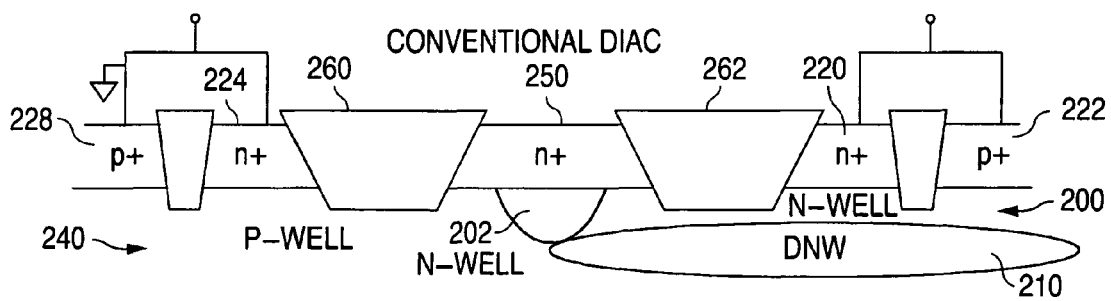
FIG. 3 is a sectional side view through another asymmetrical prior art DIAC.
Figure 4:
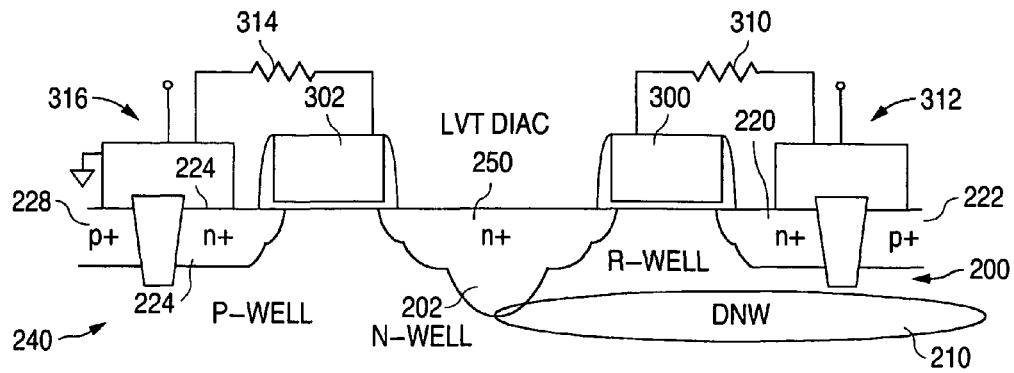
FIG. 4 is a sectional side view through one embodiment of a DIAC-like structure of the invention.

The prior art structure of FIG. 3 is similar to that described above with respect to FIG. 2. Similar structural elements are therefore depicted by the same reference numerals. This prior art DIAC, however, also includes a shallow trench isolation region 262 between n+ region 220 and floating n+ region 250, and a shallow trench isolation region 260 between n+ region 224 and floating n+ region 250. As in the FIG. 2 version, the one contact region defined by shorted n+ region 220 and p+ region 222 is isolated by a dual junction from the second contact region defined by the shorted n+ region 224 and p+ region 228. The dual junction is defined by a first junction between r-well 200 and n-well 202, and a second junction between n-well 202 and p-well 230. As shown in FIG. 4, the n+ region 220 and p+ region 222 are formed in the r-well 200, which is isolated from adjacent p-well 240 by deep n-well 210 and n-well 202. As in the case of FIG. 2, the p+ region 228 and n+ region 224 are formed in the p-well 240. The triggering of the device is determined by the breakdown of the diffusion blocking junction between n+ region 220 and the r-well 200. One embodiment of the present invention is shown in FIG. 4. For ease of reference similar structural elements to the prior art device in FIG. 3, are depicted by the same reference numerals as were used in FIG. 3. In contrast to the prior art structure shown in FIG. 3, the embodiment of FIG. 4 includes two CMOS structures, which replace the shallow trench isolation regions 260, 262 of the FIG. 3 structure. The first CMOS device is defined by the n+ region 220, the n+ region 250 and a gate 300 over a channel defined by the r-well 200. The second CMOS device is defined by the n+ region 224, the n+ region 250 and a gate 302 formed over a channel defined by the p-well 240. As in the prior art DIAC, the n+ region 220 is shorted to the p+ region 222 to define one contact region. Similarly, the n+ region 224 is shorted to the p+ region 228 to define a second contact region. In this embodiment, however, the gate 300 is connected via a resistor 300 to the contact region 312. The gate 302 is in turn connected via the resistor 314 to the contact region 316. Thus, in this case the turn on of the device is not defined by the breakdown of the n+ to p-well junction (with VBR or about 12V) but by the turn-on of the CMOS structures.

Figure 5:
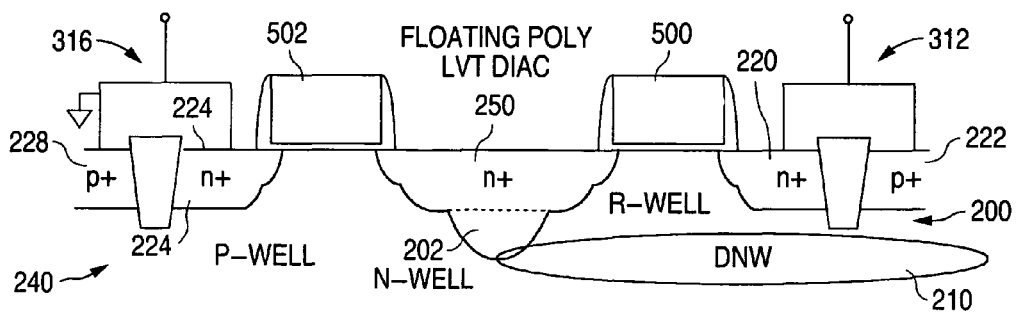
FIG. 5 is a sectional side view through another embodiment of a DIAC-like structure of the invention.
Figure 6:
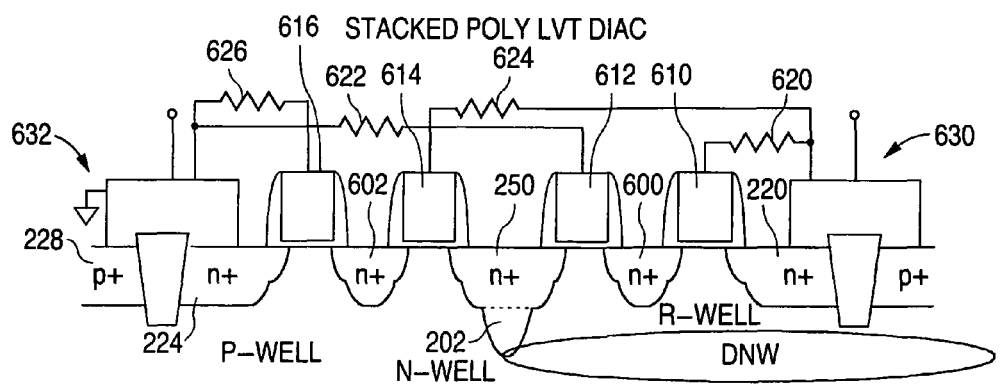
FIG. 6 is a sectional side view through yet another embodiment of a DIAC-like structure of the invention.

Appropriate gate couplings allow for low voltage turn-on of the device in both directions. In the embodiment of FIG. 5 the poly gates 500, 502 are left floating. The other structural elements are depicted by the same reference numerals as in the embodiment of FIG. 4 insofar as they are similar to the elements in FIG. 4. For elevated voltage tolerance a stacked NMOS version is provided that supports higher voltages while still allows triggering below the n+ to p-well breakdown. One such embodiment is shown in FIG. 6, which provides for 4 poly gates 610, 612, 614, 616 between contact regions 630, 632. This provides for 4 CMOS structures in series, defined by n+ region 220 and n+ region 600; n+ region 600 and n+ region 250; n+ region 250 and n+ region 602; n+ region 602 and n+ region 224. In this embodiment the poly gates are individually biased by connecting gates 610 and 614 through resistors 620 and 624, respectively to the pad voltage, and connecting gates 612 and 616 through resistors 622 and 626, respectively to ground.

Figure 1:
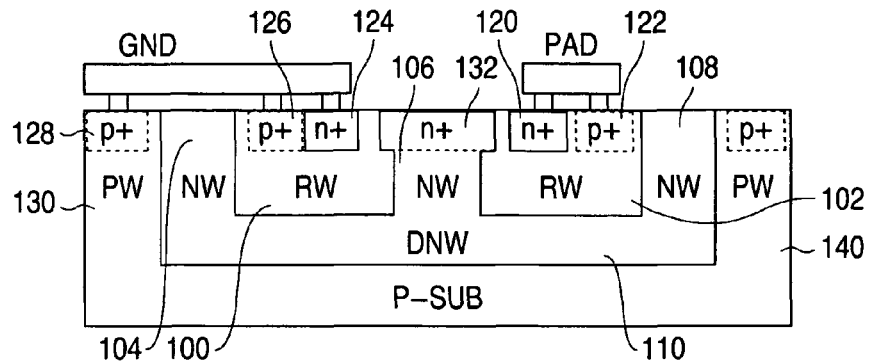
FIG. 1 is a sectional side view through a symmetrical prior art DIAC.

In the above embodiments, asymmetrical structures are depicted but it will be appreciated that the invention could similarly be implemented in asymmetrical configurations in which the left hand contact region (defined by p+ region 228 and n+ region 224) are formed in an R-well similar to RW 100 in the prior art structure shown in FIG. 1.

The present DIAC-like configuration provides a significant improvement in dual direction and system level I/O design by providing for more precise triggering voltage.

While specific embodiments were discussed above, it will be appreciated that the device can be implemented in different ways without departing from the scope of the invention as defined by the claims.

What is claimed is:

1. A DIAC-like structure comprising
   a first n+ region and a first p+ region formed in an R-well to define a first contact region,
   a second n+ region and a second p+ region spaced laterally from the first contact region,
   at least a first MOS device formed between the first and second contact regions,
   wherein the first MOS device is defined by a first gate formed over a first channel region between the first n+ region and a floating n+ region,
   a second MOS device defined by a second gate formed over a second channel region between the floating n+ region and the second n+ region,
   wherein the first n+ region and first p+ region are connected to a high voltage node or pad, and the second n+ region and second p+ region are connected to a low voltage node,
   additional MOS devices between a first contact region as defined by the first n+ region and the first p+ region, and a second contact region as defined by the second n+ region and the second p+ region, each MOS device including a gate,
   wherein the gates of the MOS devices are individually biased,
   wherein alternate gates are connected to the high voltage node, while the other gates are connected to the low voltage node.

2. A structure of claim 1, wherein the gate of the first MOS device is biased by connecting it via a first resistor to the high voltage node.

3. A structure of claim 2, wherein the gate of the second MOS device is biased by connecting it via a second resistor to the low voltage node.

4. A method of lowering the triggering voltage of a DIAC that includes a first n+ region and a first p+ region defining a first contact region or high voltage node or pad spaced laterally from a second n+ region and a second p+ region defining a second contact region or low voltage node, and including an n+ floating region in the space between the first and second contact regions, the method comprising providing at least one MOS structure between the first and second contact regions;
   wherein the first n+ region and first p+ region are formed in a first r-well or first p-well, and the second n+ region and second p+ region are formed in a second r-well or second p-well, the method comprising providing a first MOS structure and a second MOS structure between the first and second contact regions;
   wherein the first MOS structure is a first NMOS structure defined by the first n+ region and the n+ floating region with a first channel region between the first n+ region and the n+ floating region defined by part of the first r-well or first p well;
   wherein the second MOS structure is a second NMOS structure defined by the second n+ region and the n+ floating region with a second channel region between the second n+ region and the n+ floating region defined by part of the second r-well or second p-well;
   wherein a poly gate is formed above each of the channel regions;
   wherein at least one of the poly gates is biased;
   further comprising more than two MOS devices are formed between the first and second contact regions, wherein alternate gates are connected to the high voltage node, while the other gates are connected to the low voltage node.

* * * * *